(12) United States Patent
Tu et al.

(10) Patent No.: US 6,602,749 B2
(45) Date of Patent: Aug. 5, 2003

(54) CAPACITOR UNDER BITLINE (CUB) MEMORY CELL STRUCTURE WITH REDUCED PARASITIC CAPACITANCE

(75) Inventors: Kuo-Chi Tu, Hsinchu (TW); Wen-Jya Liang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 3 days.

(21) Appl. No.: 09/955,461

(22) Filed: Sep. 17, 2001

(65) Prior Publication Data

US 2003/0054607 A1 Mar. 20, 2003

(51) Int. Cl.[7] .......................................... H01L 21/8242
(52) U.S. Cl. ...................... 438/253; 438/241; 438/396; 438/386; 438/639; 438/239; 438/256; 438/390; 438/399; 438/637; 438/672; 257/300; 257/296; 257/203; 257/390; 257/306
(58) Field of Search ................................. 438/241, 253, 438/396, 639, 239, 256, 390, 399, 637, 386, 672; 257/300, 296, 203, 390, 306

(56) References Cited

U.S. PATENT DOCUMENTS

| | | | |
|---|---|---|---|
| 5,206,183 A | | 4/1993 | Dennison |
| 5,879,987 A | * | 3/1999 | Wang ............................ 438/253 |
| 6,037,213 A | * | 3/2000 | Shih et al. .................... 438/253 |
| 6,133,110 A | * | 10/2000 | Peng ............................ 438/397 |
| 6,207,579 B1 | * | 3/2001 | Chen ............................ 438/706 |
| 6,246,087 B1 | | 6/2001 | Lee et al. |
| 6,429,476 B2 | * | 8/2002 | Suzuki et al. ................ 257/296 |
| 6,444,575 B1 | * | 9/2002 | Yu et al. ...................... 438/639 |
| 6,472,266 B1 | * | 10/2002 | Yu et al. ...................... 438/241 |

* cited by examiner

Primary Examiner—Matthew Smith
Assistant Examiner—V. Yevsikov
(74) Attorney, Agent, or Firm—Tung & Associates

(57) ABSTRACT

Within a method for forming a memory cell structure there is provided a field effect transistor (FET) device having electrically connected to one of its source/drain regions a storage capacitor and electrically connected to the other of its source/drain regions a bitline stud layer separated from and rising above the storage capacitor. Within the memory cell structure, and at a minimum storage capacitor to bitline stud layer separation, a capacitor plate layer is further separated from the bitline stud layer than a capacitor node layer.

16 Claims, 3 Drawing Sheets

CAPACITOR UNDER BITLINE (CUB) MEMORY CELL STRUCTURE WITH REDUCED PARASITIC CAPACITANCE

BACKGROUND OF THE INVENTION

1. Field of the Invention

The present invention relates generally to memory cell structures employed within semiconductor integrated circuit microelectronic fabrications. More particularly, the present invention relates to methods for fabricating memory cell structures employed within semiconductor integrated circuit microelectronic fabrications.

2. Description of the Related Art

Semiconductor integrated circuit microelectronic fabrications are formed from semiconductor substrates within and upon which are formed semiconductor devices, and over which are formed patterned conductor layers which are separated by dielectric layers.

Common in the art of semiconductor integrated circuit microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprises a field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor stud which introduces or retrieves charge with respect to the storage capacitor.

While the dynamic random access memory (DRAM) cell structure has clearly become ubiquitous in the art of semiconductor integrated circuit microelectronic memory fabrication, and is thus essential in the art of semiconductor integrated circuit microelectronic fabrication, the dynamic random access memory (DRAM) cell structure is nonetheless not entirely without problems in the art of semiconductor integrated circuit microelectronic memory fabrication.

In that regard, as semiconductor integrated circuit microelectronic fabrication integration levels have increased and semiconductor device and patterned conductor layer dimensions have decreased, it has become increasingly difficult in the art of semiconductor integrated circuit microelectronic fabrication, and in particular in the art of semiconductor integrated circuit microelectronic memory fabrication, to readily form dynamic random access memory (DRAM) cell structures with enhanced performance.

It is thus desirable in the art of semiconductor integrated circuit microelectronic fabrication, and in particular in the art of semiconductor integrated circuit microelectronic memory fabrication, to provide methods and materials through which there may be readily formed, with enhanced performance, dynamic random access memory (DRAM) cell structures.

It is towards the foregoing object that the present invention is directed.

Various methods have been disclosed in the art of semiconductor integrated circuit microelectronic fabrication for forming, with desirable properties, dynamic random access memory (DRAM) cell structures.

Included among the methods, but not limited among the methods, are methods disclosed within: (1) Dennison, in U.S. Pat. No. 5,206,183 (a method for forming a capacitor under bitline (CUB) dynamic random access memory (DRAM) cell structure for use within a semiconductor integrated circuit microelectronic memory fabrication, with improved fabrication alignment, by employing when fabricating the capacitor under bitline (CUB) dynamic random access memory (DRAM) cell structure several sacrificial polyimide masking layers); and (2) Lee et al., in U.S. Pat. No. 6,246,087 (a method for forming a capacitor over bitline (COB) dynamic random access memory (DRAM) cell structure for use within a semiconductor integrated circuit microelectronic memory fabrication, with enhanced fabrication reliability, by forming within the capacitor over bitline (COB) dynamic random access memory (DRAM) cell structure a bitline stud layer while employing a multi-step masking method).

Desirable in the art of semiconductor integrated circuit microelectronic fabrication, and in particular in the art of semiconductor integrated circuit microelectronic memory fabrication, are additional methods and materials which may be employed for forming, with enhanced performance, dynamic random access memory (DRAM) cell structures.

It is towards the foregoing object that the present invention is directed.

SUMMARY OF THE INVENTION

A first object of the invention is to provide a method for forming a dynamic random access memory (DRAM) cell structure within a semiconductor integrated circuit microelectronic fabrication.

A second object of the present invention is to provide a method in accord with the first object of the present invention, wherein the dynamic random access memory (DRAM) cell structure is formed with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a memory cell structure, and a memory cell structure fabricated employing the method.

To practice the method of the present invention, there is first provided a semiconductor substrate. There is then formed within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode. There is then formed over the field effect transistor (FET) device, and electrically connected with one of the pair of source/drain regions, a storage capacitor comprising a capacitor node layer connected with the one of the pair of source/drain regions, a capacitor dielectric layer formed upon the capacitor node layer and a capacitor plate layer formed upon the capacitor dielectric layer. There is also formed over the field effect transistor (FET) device and electrically connected with the other of the pair of source/drain regions a bitline stud layer laterally separated from and rising above the storage capacitor, where at a minimum storage capacitor to bitline stud layer separation distance the capacitor plate layer is further separated from the bitline stud layer than the capacitor node layer.

The method of the present invention contemplates a dynamic random access memory (DRAM) cell structure fabricated in accord with the method of the present invention.

The present invention provides a method for forming a dynamic random access memory (DRAM) cell structure within a semiconductor integrated circuit microelectronic fabrication, wherein the dynamic random access memory (DRAM) cell structure is readily formed with enhanced performance.

The present invention realizes the foregoing object within the context of a capacitor under bitline (CUB) dynamic random access memory (DRAM) cell structure by providing, at a minimum storage capacitor to bitline stud layer separation distance, that a capacitor plate layer is further separated from a bitline stud layer than a capacitor node layer within the capacitor under bitline (CUB) dynamic random access memory (DRAM) cell structure.

The method of the present invention is readily commercially implemented.

The present invention employs methods and materials as are generally known in the art of semiconductor integrated circuit microelectronic fabrication, but employed within the context of specific process orderings and specific materials limitations to provide the method for fabricating a memory cell structure in accord with the present invention. Since it is thus at least in part a specific process ordering and specific material limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming a dynamic random access memory (DRAM) cell structure within a semiconductor integrated circuit microelectronic fabrication, wherein the dynamic random access memory (DRAM) cell structure is formed with enhanced performance.

The present invention realizes the foregoing object within the context of a capacitor under bitline (CUB) dynamic random access memory (DRAM) cell structure by providing, at a minimum storage capacitor to bitline stud layer separation distance, that a capacitor plate layer is further separated from a bitline stud layer than a capacitor node layer within the capacitor under bitline (CUB) dynamic random access memory (DRAM) cell structure.

Within the present invention, a storage capacitor is preferably formed in the shape of a stacked container capacitor.

Figure 1:
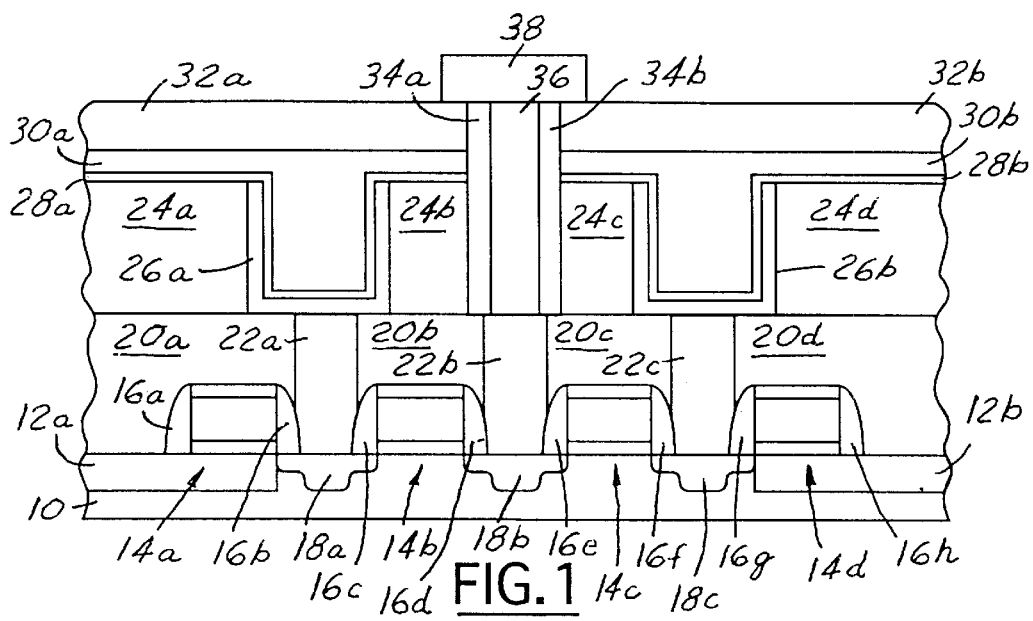
FIG. 1 shows a schematic cross-sectional diagram of a capacitor under bitline (CUB) dynamic random access memory cell structure within which may be practiced the present invention.

Referring now to FIG. 1, there is shown a schematic cross-sectional diagram of a semiconductor integrated circuit microelectronic fabrication having formed therein a dynamic random access memory (DRAM) cell structure within which may be practiced the present invention.

As is illustrated within the schematic cross-sectional diagram of FIG. 1, the dynamic random access memory (DRAM) cell structure comprises in a first instance a semiconductor substrate 10 having formed therein a pair of isolation regions 12a and 12b which define an active region of the semiconductor substrate 10. Similarly, there is also illustrated within the schematic cross-sectional diagram of FIG. 1: (1) a pair of gate electrode stack layers 14b and 14c formed upon the active region of the semiconductor substrate 10; and (2) a pair of interconnect stack layers 14a and 14d formed upon the corresponding isolation regions 12a and 12b. As is understood by a person skilled in the art, the pair of gate electrode stack layers 14b and 14c and the pair of interconnect stack layers 14a and 14d further comprise a pair of gate dielectric layers having formed aligned thereupon a pair of gate electrodes in turn having formed aligned thereupon a pair of capping dielectric layers.

There is also shown within the schematic cross-sectional diagram of FIG. 1 formed adjoining a pair of opposite edges of the pair of gate electrode stack layers 14b and 14c and the pair of interconnect stack layers 14a and 14d a series of spacer layers 16a, 16b, 16c, 16d, 16e, 16f, 16g and 16h. And finally, there is also shown within the schematic cross-sectional diagram of FIG. 1 with respect to the active region of the semiconductor substrate a series of source/drain regions 18a, 18b and 18c, separated, as appropriate, by the pair of isolation regions 12a and 12b and the pair of gate electrode stack layers 14b and 14c, to thus provide a pair of field effect transistor (FET) devices within and upon the active region of the semiconductor substrate 10.

With respect to each of the foregoing structures starting with the semiconductor substrate 10 and including the series of structures which comprises the pair of field effect transistor (FET) devices and the pair of interconnect stack layers 14a and 14d, each of the foregoing structures may be formed employing methods, materials and dimensions as are conventional in the art of semiconductor integrated circuit microelectronic fabrication.

Shown also within the schematic cross-sectional diagram of FIG. 1, and formed passivating the pair of field effect transistor (FET) devices and the pair of interconnect stack layers 14a and 14d is a series of patterned pre-metal dielectric (PMD) layers 20a, 20b, 20c and 20d which defines a series of first apertures, one each reaching each of the series of source/drain regions 18a, 18b and 18c. Similarly, there is also shown within the schematic cross-sectional diagram of FIG. 1 and filled into the series of three first apertures a series of conductor landing stud layers 22a, 22b and 22c.

Within the preferred embodiment of the present invention, each of the series of patterned pre-metal dielectric (PMD) layers 20a, 20b, 20c and 20d is typically and preferably formed at least in part of a silicon oxide material, as is conventional in the art of semiconductor integrated circuit microelectronic fabrication. Similarly, within the preferred embodiment of the present invention, each of the series of conductor landing stud layers 22a, 22b and 22c is formed of a conductor material such as but not limited to a tungsten conductor material or a doped polysilicon conductor material (having a dopant concentration of greater than about 1E18 dopant atoms per cubic centimeter), as is also conventional in the art of semiconductor integrated circuit microelectronic fabrication.

Referring again to FIG. 1, there is shown formed upon the series of patterned pre-metal dielectric layers 20a, 20b, 20c and 20d and forming a series of second apertures which leaves exposed portions of the conductor landing stud layers 22a, 22b and 22c, a series of patterned capacitor node dielectric layers 24a, 24b, 24c and 24d. Further, within the pair of second apertures defined by the corresponding pairs of capacitor node dielectric layers 20a and 20b, and 20c and 20d, there is formed a pair of patterned capacitor node layers 26a and 26b.

Within the preferred embodiment of the present invention, the series of patterned capacitor node dielectric layers 24a, 24b, 24c and 24d may be formed employing methods and dielectric materials as are conventional in the art of semiconductor integrated circuit microelectronic fabrication, but with an etch selectivity with respect to the dielectric material from which is formed the series of patterned pre-metal dielectric (PMD) layers 20a, 20b, 20c and 20d. Similarly, the pair of patterned capacitor node layers 26a and 26b may also be formed employing methods and conductor materials as are conventional in the art of semiconductor integrated circuit microelectronic fabrication, but will typically and preferably be formed of a doped polysilicon conductor material.

Shown also within the schematic cross-sectional diagram of FIG. 1, and formed in part upon the pair of patterned capacitor node layers 26a and 26b, is: (1) a corresponding pair of capacitor dielectric layers 28a and 28b, having formed aligned thereupon; (2) a corresponding pair of patterned capacitor plate layers 30a and 30b, in turn having formed thereupon; (3) a corresponding pair of patterned capping dielectric layers 32a and 32b.

Finally, there is also shown within the schematic cross-sectional diagram of FIG. 1, and formed into the second aperture defined in part by the pair of patterned capacitor node dielectric layers 24b and 24c, a pair of patterned dielectric spacer layers 34a and 34b which separate a bitline stud layer 36 from the pair of patterned capacitor plate layers 30a and 30b. Finally, the bitline stud layer 36 has formed contacting thereto a patterned first conductor layer 38.

While the dynamic random access memory (DRAM) cell structure whose schematic cross-sectional diagram is illustrated in FIG. 1 provides a generally operational dynamic random access memory (DRAM) cell structure, such a dynamic random access memory (DRAM) cell structure is generally susceptible to enhanced patterned capacitor plate layer 30a or 30b to bitline stud layer 36 capacitance coupling. Such enhanced capacitance coupling generally provides for deteriorated dynamic random access memory (DRAM) cell structure performance.

To alleviate within the dynamic random access memory (DRAM) cell structure whose schematic cross-sectional diagram is illustrated in FIG. 1 the foregoing capacitance coupling, the present invention provides for a novel method and a novel structure with respect to forming a patterned capacitor plate layer which may be employed within a dynamic random access memory (DRAM) cell structure analogous to the dynamic random access memory (DRAM) cell structure whose schematic cross-sectional diagram is illustrated in FIG. 1. Structural considerations of the patterned capacitor plate layer are illustrated by reference to the schematic plan-view diagrams of FIG. 2 and FIG. 3.

Figure 2:
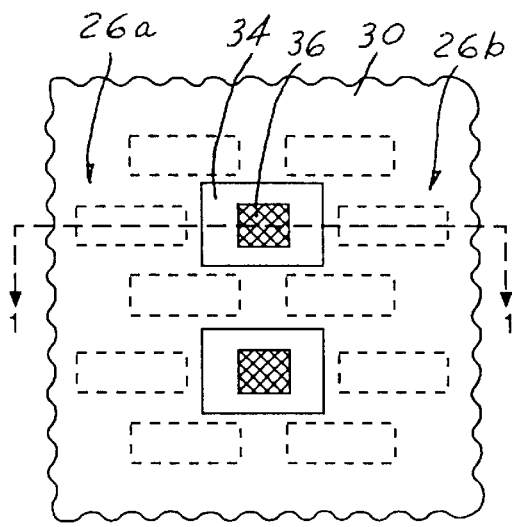
FIG. 2 shows a schematic plan-view diagram correlating in general with the schematic cross-sectional diagram of FIG. 1.

Shown in FIG. 2 is a schematic plan-view diagram of a semiconductor integrated circuit microelectronic fabrication corresponding with the semiconductor integrated circuit microelectronic fabrication whose schematic cross-sectional diagram is illustrated in FIG. 1. Within the schematic plan-view diagram of FIG. 1, there is shown the locations of a series of patterned capacitor node layers, including the pair of patterned capacitor node layers 26a and 26b, beneath a patterned capacitor plate layer 30. Similarly, there is also illustrated within the schematic plan-view diagram of FIG. 1, and penetrated through the patterned capacitor plate layer 30, the bitline stud layer 36 which is annularly separated from the patterned capacitor plate layer 30 by the dielectric spacer layer 34. Other layers within the dynamic random access memory (DRAM) cell structure whose schematic cross-sectional diagram is illustrated in FIG. 1 have been omitted within the schematic plan-view diagram of FIG. 2, in order to provide clarity with respect to features of the present invention.

Figure 3:
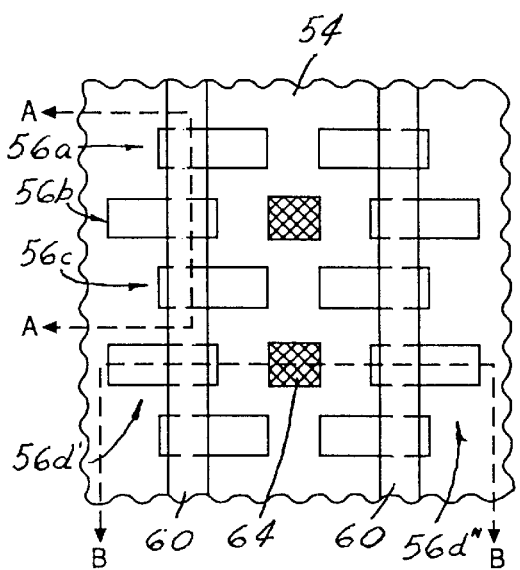
FIG. 3 shows a schematic plan-view diagram illustrating in part a capacitor under bitline (CUB) dynamic random access memory (DRAM) memory cell structure in accord with the present invention.

Referring now to FIG. 3, there is shown a schematic plan-view diagram which corresponds generally with the schematic plan-view diagram of FIG. 2, but wherein there is formed a patterned capacitor plate layer in accord with the present invention.

As is illustrated within the schematic plan-view diagram of FIG. 3, there is shown the locations of a series of patterned capacitor node layers including the series of patterned capacitor node layers 56a, 56b, 56c, 56d' and 56d", which correspond generally with the series of patterned capacitor node layers as illustrated within the schematic plan-view diagram of FIG. 2. However, within the schematic plan-view diagram of FIG. 3, the series of patterned capacitor node layers is spanned by a pair of strip like patterned capacitor plate layers 60 (which are generally electrically connected), rather than a more areally dense plate like patterned capacitor plate layer 30 as illustrated within the schematic plan-view diagram of FIG. 2. Also illustrated within the schematic plan-view diagram of FIG. 3 is a bitline stud layer 64 which corresponds with the bitline stud layer 36 within the schematic plan-view diagram of FIG. 2. The bitline stud layer 64 and the patterned capacitor node layers are separated by a patterned capacitor node dielectric layer 54. Finally, there is shown within the schematic plan-view diagram of FIG. 3 an A—A cross-section reference and a B—B cross-section reference, which provide for correspondence for a series of schematic cross-sectional diagrams which follow. As is illustrated within the schematic plan-view diagram of FIG. 3, at a minimum separation distance of a patterned capacitor node layer (such as the patterned capacitor node layer 56a, 56b or 56c) from a bitline stud layer (such as the bitline stud layer 64) a patterned capacitor plate layer (such as the patterned capacitor plate layer 60) is further separated from the bitline stud layer than the patterned capacitor node layer.

Referring now to FIG. 4 to FIG. 10, there is shown a series of schematic cross-sectional diagrams illustrating the results of progressive stages of fabrication of a semiconductor integrated circuit microelectronic fabrication having formed therein a dynamic random access memory (DRAM) cell structure from which is derived the dynamic random access memory (DRAM) cell structure whose schematic plan-view diagram is illustrated in FIG. 3.

Figure 4:
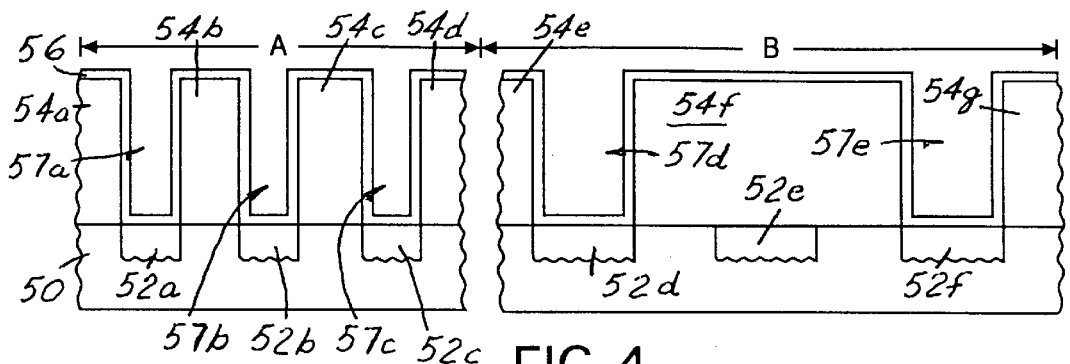
FIG. 4 to FIG. 10 show a series of schematic cross-sectional diagrams illustrating the results of progressive stages of forming, in accord with a preferred embodiment of the present invention, a capacitor under bitline (CUB) dynamic random access memory cell structure within a semiconductor integrated circuit microelectronic fabrication.

Shown in FIG. 4 is a schematic cross-sectional diagram of the semiconductor integrated circuit microelectronic fabrication at an early stage in its fabrication in accord with the preferred embodiment of the present invention.

Shown in FIG. 4 is a semiconductor substrate 50 having formed therein a series of conductor landing studs 52a, 52b, 52c, 52d, 52e and 52f.

Within the preferred embodiment of the present invention, the semiconductor substrate 50 is intended to correspond with the semiconductor substrate 10 as illustrated within the schematic cross-sectional diagram of FIG. 1, but also to incorporate the field effect transistor (FET) structures and interconnect structures as illustrated within the schematic cross-sectional diagram of FIG. 1. The additional structures are omitted from the schematic cross-sectional diagram of FIG. 4 for purposes of clarity in describing the present invention. Similarly, within the preferred embodiment of the present invention, the series of conductor landing studs 52a, 52b, 52c, 52d, 52e and 52f is analogous, equivalent or identical to the series of conductor landing studs 22a, 22b and 22c as illustrated within the schematic cross-sectional diagram of FIG. 1, but not illustrated in their entirety within the schematic cross-sectional diagram of FIG. 4, also for purposes of clarity.

Shown also within the schematic cross-sectional diagram of FIG. 4, and formed upon the semiconductor substrate 50 having formed therein the series of conductor landing studs 52a, 52b, 52c, 52d, 52e and 52f is a series of patterned capacitor node dielectric layers 54a, 54b, 54c, 54d, 54e, 54f and 54g which define a series of apertures which expose upper surfaces of the conductor landing studs 52a, 52b, 52c, 52d and 52f.

Within the preferred embodiment of the present invention, the series of patterned capacitor node dielectric layers 54a, 54b, 54c, 54d, 54e, 54f and 54g is otherwise conventional in the art of semiconductor integrated circuit microelectronic fabrication and formed to a thickness of from about 8000 to about 18000 angstroms. Similarly, within the preferred embodiment of the present invention, the blanket capacitor node layer 56 is typically and preferably formed of a doped polysilicon material formed conformally to a thickness of from about 300 to about 700 angstroms, such as to define a series of second apertures 57a, 57b, 57c, 57d and 57e.

Figure 5:
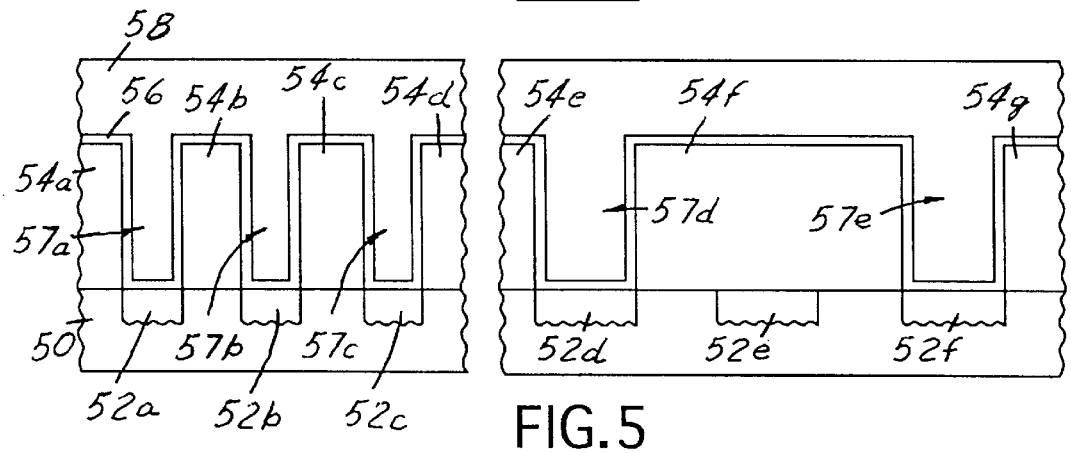

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there is formed upon the blanket capacitor node layer 56 and filling the series of second apertures 57a, 57b, 57c, 57d and 57e a blanket photoresist layer 58.

Within the preferred embodiment of the present invention, and for reasons which will become clearer below, the blanket photoresist layer 58 is typically and preferably formed of a positive photoresist material, formed to a thickness of from about 4000 to about 7000 angstroms.

Figure 6:
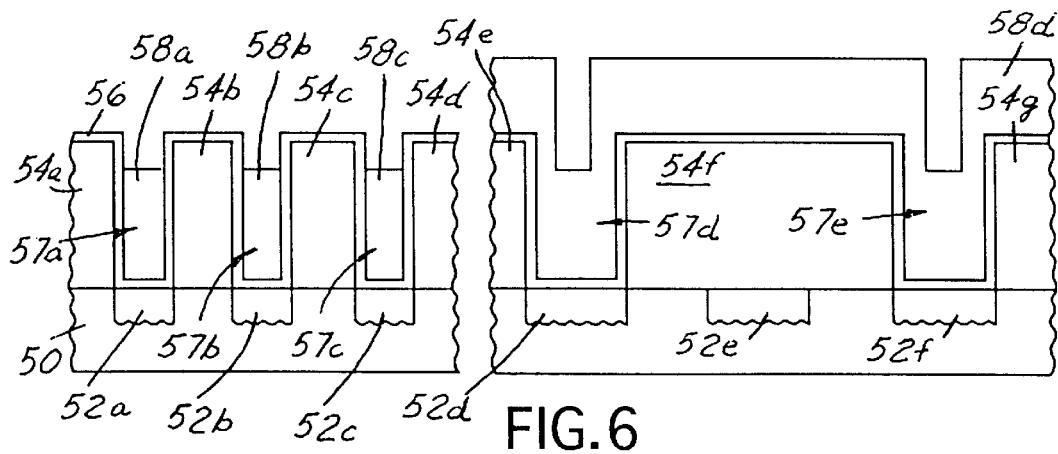

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the blanket photoresist layer 58 has been masked, partially exposed and partially developed to form: (1) a series of patterned photoresist layers 58a, 58b and 58c within the series of second apertures 57a, 57b and 57c aligned above the series of series of conductor landing studs 52a, 52b and 52c to leave exposed portions of the blanket capacitor node layer 56; and (2) a patterned photoresist layer 58d which spans the pair of apertures 57d and 57e which are aligned above the pair of conductor landing studs 52d and 52f while not exposing a portion of the blanket capacitor node layer 56.

Within the preferred embodiment of the present invention, the blanket photoresist layer 58 as illustrated within the schematic cross-sectional diagram of FIG. 5 may be selectively and partially photoexposed and partially developed to provide the series of patterned photoresist layers 58a, 58b, 58c and 58d as illustrated within the schematic cross-sectional diagram of FIG. 6 while employing methods as are generally conventional in the art of microelectronic fabrication. However, within the context of the present invention special attention should be provided such as not to overexpose the blanket photoresist layer 58.

Within the preferred embodiment of the present invention, the series of patterned photoresist layers 58a, 58b and 58c is recessed within each of the apertures 57a, 57b and 57c to a depth of from about 1000 to about 3000 angstroms beneath the upper surface of the series of patterned capacitor node dielectric layers 54a, 54b, 54c, 54d, 54e, 54f and 54g.

Figure 7:
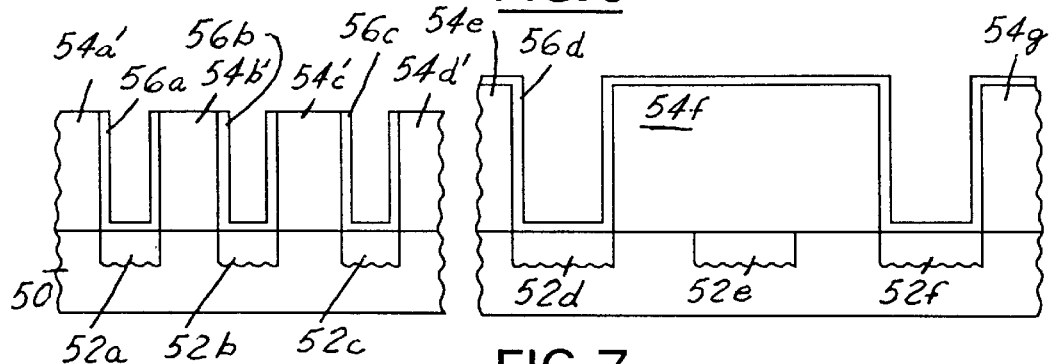

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein: (1) the blanket capacitor node layer 56 has been patterned to form a series of patterned capacitor node layers 56a, 56b, 56c and 56d; (2) the series of patterned capacitor node dielectric layers 54a, 54b, 54c and 54d has been etched to form a series of etched patterned capacitor node dielectric layers 54a', 54b', 54c' and 54d' of lesser height by about 1000 to about 3000 angstroms; and (3) the series of patterned photoresist layers 58a, 58b, 58c and 58d has been stripped from the semiconductor integrated circuit microelectronic fabrication.

Within the preferred embodiment of the present invention the exposed portions of the blanket capacitor node layer 56 may be etched to form the series of patterned capacitor node layers 56a, 56b, 56c and 56d while employing etch methods including but not limited to wet chemical etch methods and dry plasma etch methods. Similarly, within the preferred embodiment of the present invention the series of patterned capacitor node dielectric layers 54a, 54b, 54c and 54d may be etched to form the series of etched patterned capacitor node dielectric layers 54a', 54b', 54c' and 54d' while also employing etch methods including but not limited to wet chemical etch methods and dry plasma etch methods. Finally, within the preferred embodiment of the present invention the series of patterned photoresist layers 58a, 58b, 58c and 58d may be stripped employing methods including but not limited to wet chemical stripping methods or dry plasma stripping methods.

As is understood by a person skilled in the art, and as a result of the processing as illustrated within the schematic cross-sectional diagram of FIG. 7, there is formed a series of notches within the capacitor node layers 56a, 56b and 56c within the A—A direction as illustrated within the schematic plan-view diagram of FIG. 3, but not within the B—B direction as illustrated within the schematic plan-view diagram of FIG. 3. Each of the series of notches is formed to a depth of from about 1000 to about 3000 angstroms.

Figure 8:
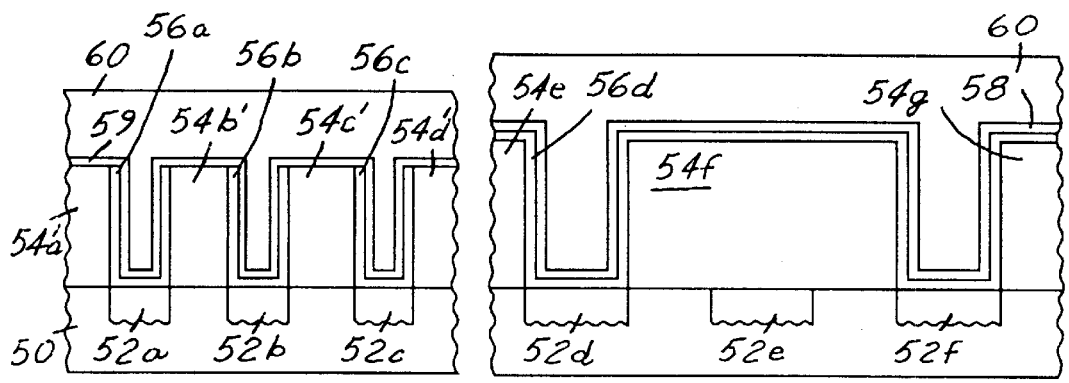

Referring now to FIG. 8, there is shown a schematic cross-sectional diagram illustrating the result of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein: (1) there is formed upon exposed surfaces of the patterned capacitor node layers 56a, 56b, 56c and 56d a blanket capacitor dielectric layer 59; and (2) there is formed upon the blanket capacitor dielectric layer 58 a blanket capacitor plate layer 60.

Within the preferred embodiment of the present invention, the blanket capacitor dielectric layer 59 may be formed of capacitor dielectric materials as are conventional in the art of microelectronic fabrication, including but not limited to the more conventional type silicon oxide and silicon nitride capacitor dielectric materials, as well as less conventional type higher dielectric constant capacitor dielectric materials, such as but not limited to barium strontium titanate (BST) dielectric materials and lead zirconium titanate (PZT) dielectric materials. Typically and preferably, the blanket capacitor dielectric layer 59 is formed to a thickness of from about 40 to about 60 angstroms. Similarly, the blanket capacitor plate layer 60 may be formed employing methods and materials as are conventional in the art of microelectronic fabrication, and will typically comprise doped polysilicon materials. Typically and preferably, the blanket capacitor plate layer 60 is formed to a thickness of from about 3000 to about 6000 angstroms.

Figure 9:
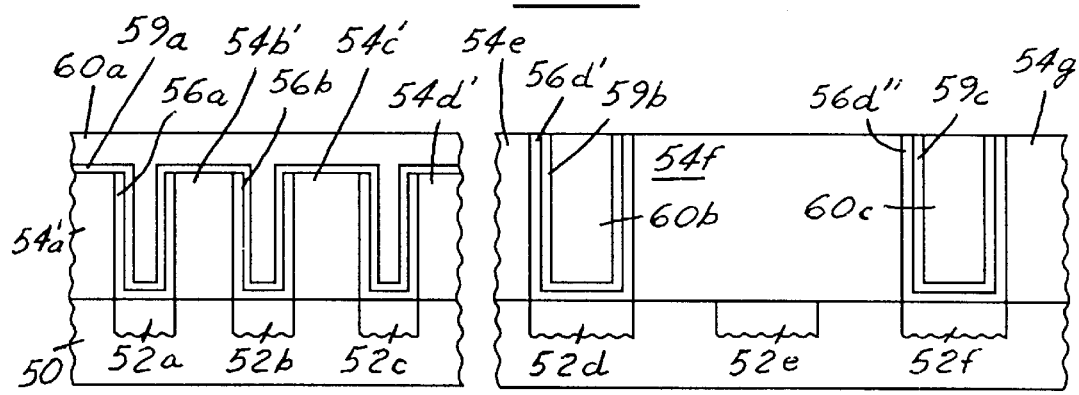

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein the blanket capacitor plate layer 60 and the blanket capacitor dielectric layer 59 have been planarized to form: (1) a corresponding patterned capacitor plate layer 60a and patterned capacitor dielectric layer 59a filling and spanning the series of apertures within the A—A region of the semiconductor substrate 50; and (2) a pair of patterned capacitor dielectric layers 59b and 59c having formed thereupon a pair of patterned capacitor plate layers 60b and 60c within the B—B region of the semiconductor substrate 50.

Thus, as is illustrated within the schematic cross-sectional diagram of FIG. 9, within the A—A cross-sectional region of the semiconductor substrate 50 the patterned capacitor plate layer 60a spans over the etched patterned capacitor node layers 56a', 56b' and 56c' since the series of etched patterned capacitor node layers 56a', 56b' and 56c' have formed therein the series of notches in the A—A cross-sectional direction, while in the perpendicular B—B cross-sectional region the pair of patterned capacitor plate layers 60b and 60c is contained within the dimensions of the patterned capacitor node layers 56d' and 56d' since they are formed without notching in the B—B cross-sectional direction.

Figure 10:
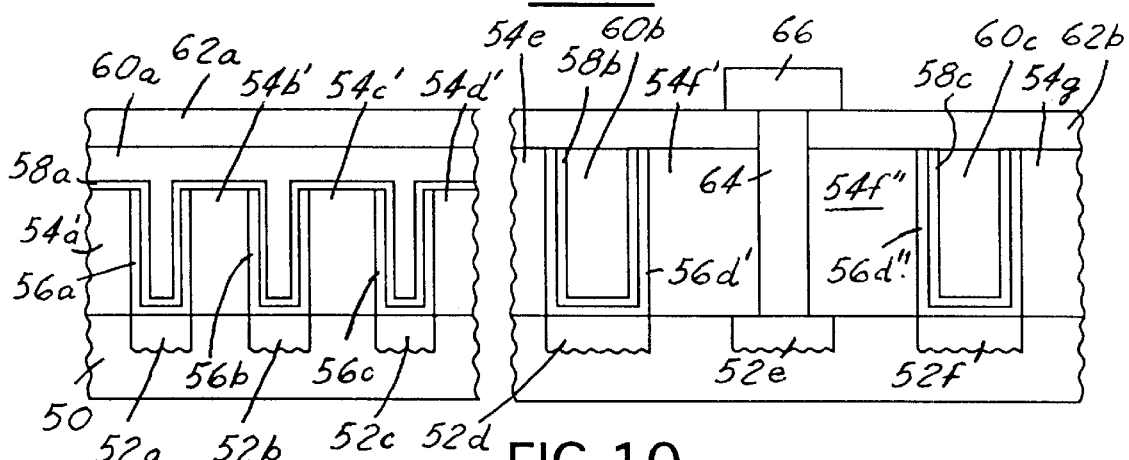

Referring now to FIG. 10, there is shown a schematic cross-sectional diagram illustrating the results of further processing of the semiconductor integrated circuit microelectronic fabrication whose schematic cross-sectional diagram is illustrated in FIG. 9.

Shown in FIG. 10 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 9, but wherein there is formed upon the semiconductor integrated circuit microelectronic fabrication a blanket capping layer (not specifically illustrated) which in turn is patterned to form a pair of patterned capping layers 62a and 62b in turn aligned in part with a pair of twice patterned capacitor node dielectric layers 54f' and 54f'' formed from the patterned capacitor node dielectric layer 54f.

Within the preferred embodiment of the present invention, the blanket capping layer may be formed of dielectric materials as are conventional in the art of microelectronic fabrication. Typically and preferably the blanket capping layer is formed to a thickness of from about 2000 to about 4000 angstroms. Similarly, the blanket capping layer and the patterned capacitor node dielectric layer 54f may be patterned employing methods as are conventional in the art of semiconductor integrated circuit microelectronic fabrication.

Finally, there is shown within the schematic cross-sectional diagram of FIG. 10, and formed into a third aperture defined by the pair of patterned capping layers 62a and 62b and the pair of twice patterned capacitor node dielectric layers 54f' and 54f'', a bitline stud layer 64. There is similarly also shown within the schematic cross-sectional diagram of FIG. 10 formed contacting the bitline stud layer 64 and spanning over the pair of patterned capping layers 62a and 62b a patterned first conductor layer 66.

Within the preferred embodiment of the present invention, both the bitline stud layer 64 and the patterned first conductor layer 66 may be formed employing methods as are conventional in the art of semiconductor integrated circuit microelectronic fabrication.

As is understood by a person skilled in the art, and as is illustrated within the schematic cross-sectional diagram of FIG. 10 in comparison with the schematic cross-sectional diagram of FIG. 1, within the present invention the bitline stud layer 64 exhibits less capacitive coupling to the patterned capacitor plate layers 60b and 60c insofar as the patterned capacitor plate layers 60b and 60c at a location closest to the bitline stud layer 64 are further separated from the bitline stud layer 64 than the patterned capacitor node layers 56d' and 56d''.

As is understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention, while still providing a method for forming memory cell structure in accord with the present invention, further in accord with the accompanying claims.

What is claimed is:

1. A method for fabricating a memory cell structure comprising:

providing a semiconductor substrate;

forming within and upon the semiconductor substrate a field effect transistor device comprising a gate dielectric layer formed upon the semiconductor substrate, a gate electrode formed upon the gate dielectric layer and a pair of source/drain regions formed into the semiconductor substrate and separated by the gate electrode;

forming over the field effect transistor device a storage capacitor comprising a capacitor node layer electrically connected with the one of the pair of source/drain regions, a capacitor dielectric layer formed upon the capacitor node layer and a capacitor plate layer formed upon the capacitor dielectric layer; and forming over the field effect transistor device and electrically connected with the other of the pair of source/drain regions a bitline stud layer laterally separated from and rising above the storage capacitor, where at a minimum capacitor node layer to bitline stud layer separation distance the capacitor plate layer is further separated from the bitline stud layer than the capacitor node layer.

2. The method of claim 1 wherein at other than the minimum storage capacitor to bitline stud layer separation distance a portion of the capacitor plate layer overlaps the capacitor node layer.

3. The method of claim 1 wherein the storage capacitor is a stacked container capacitor.

4. The method of claim 3 wherein the capacitor node layer has formed therein a notch at a location other than the minimum storage capacitor to bitline stud layer separation distance.

5. The method of claim 4 wherein the notch is formed to a depth of from about 1000 to about 3000 angstroms within the capacitor node layer.

6. The method of claim 4 wherein the capacitor plate layer is formed employing a planarizing method which planarizes the capacitor plate layer into the notch.

7. The method of claim 1 wherein the capacitor node layer is formed to a thickness of from about 300 to about 700 angstroms.

8. The method of claim 1 wherein the capacitor plate layer is formed to a thickness of from about 3000 to about 6000 angstroms.

9. A memory cell structure comprising:

a semiconductor substrate;

a field effect transistor device formed within and upon the semiconductor substrate, the field effect transistor device comprising a gate dielectric layer formed upon the semiconductor substrate, a gate electrode formed upon the gate dielectric layer and a pair of source/drain regions formed into the semiconductor substrate and separated by the gate electrode;

a storage capacitor formed over the field effect transistor device, the storage capacitor comprising a capacitor node layer electrically connected with the one of the pair of source/drain regions, a capacitor dielectric layer formed upon the capacitor node layer and a capacitor plate layer formed upon the capacitor dielectric layer; and a bitline stud layer formed over the field effect transistor device and electrically connected with the other of the pair of source/drain regions, the bitline stud layer being laterally separated from and rising above the storage capacitor, where at a minimum capacitor node layer to bitline stud layer separation distance the capacitor plate layer is further separated from the bitline stud layer than the capacitor node layer.

10. The memory cell structure of claim 9 wherein at other than the minimum storage capacitor to bitline stud layer separation distance a portion of the capacitor plate layer overlaps the capacitor node layer.

11. The memory cell structure of claim 9 wherein the storage capacitor is a stacked container capacitor.

12. The memory cell structure of claim 11 wherein the capacitor node layer has formed therein a notch at a location other than the minimum storage capacitor to bitline stud layer separation distance.

13. The memory cell structure of claim 12 wherein the notch is formed to a depth of from about 1000 to about 3000 angstroms within the capacitor node layer.

14. The memory cell structure of claim 12 wherein the capacitor plate layer is formed into the notch.

15. The memory cell structure of claim 9 wherein the capacitor node layer is formed to a thickness of from about 300 to about 700 angstroms.

16. The memory cell structure of claim 9 wherein the capacitor plate layer is formed to a thickness of from about 3000 to about 6000 angstroms.

* * * * *